United States Patent [19]

Morishita et al.

[11] Patent Number: 4,543,521
[45] Date of Patent: Sep. 24, 1985

[54] CHARGE CONTROL MICROCOMPUTER DEVICE FOR VEHICLE

[75] Inventors: Mitsuharu Morishita; Shinichi Kouge, both of Hyogo, Japan

[73] Assignee: Mitsubishi Denki Kabushiki Kaisha, Japan

[21] Appl. No.: 495,330

[22] Filed: May 17, 1983

[30] Foreign Application Priority Data

May 18, 1982 [JP] Japan .................................. 57-85204

[51] Int. Cl.⁴ ............................................. H02J 7/14
[52] U.S. Cl. ........................................ 320/64; 320/32; 320/39; 322/28
[58] Field of Search ....................... 322/28, 89, 90, 99; 320/64, 68, 35, 39, 15, 16; 290/16, 18, 36 A, 37 R, 37 A, 31, 33, 38 C, 46, 50; 123/176 B

[56] References Cited

U.S. PATENT DOCUMENTS

| 3,371,194 | 2/1968 | Ostreicher | 320/44 X |
| 3,720,839 | 3/1973 | Spahr | 290/37 |
| 4,209,816 | 6/1980 | Hansen | 290/37 A X |
| 4,308,492 | 12/1981 | Mori et al. | 320/39 X |
| 4,315,204 | 2/1982 | Sievers et al. | 322/28 |
| 4,387,334 | 6/1983 | Loper | 320/44 |
| 4,438,385 | 3/1984 | Sato et al. | 322/73 X |
| 4,482,812 | 11/1984 | Hori et al. | 290/37 R X |

Primary Examiner—R. J. Hickey
Attorney, Agent, or Firm—Sughrue, Mion, Zinn, Macpeak and Seas

[57] ABSTRACT

A charging control system for a vehicle includes a charge control microcomputer for determining the most suitable reference voltage for the charging system voltage regulator based on various input data from the charging system and an engine control microcomputer. The device also detects faults in the charging system by processing the charging system data inputs and displays the detection result on a display unit.

4 Claims, 2 Drawing Figures

CHARGE CONTROL MICROCOMPUTER DEVICE FOR VEHICLE

BACKGROUND OF THE INVENTION

This invention relates to a charging control microcomputer device for a vehicle, which externally provides a predetermined value for a voltage regulator adapted to control the output voltage of a charging generator installed in a vehicle or the like and driven by the internal combustion engine thereof, and which is capable of troubleshooting the system according to data received from the charging system.

In general, in a conventional device of this type, the output voltage of a generator driven by a vehicle engine is controlled to a predetermined value which is preset by the voltage regulator installed together with the generator. The output voltage thus controlled charges the battery of the vehicle. In this connection, the voltage regulator may include a temperature compensating circuit, as the case may be, so as to prevent a difficulty wherein the battery charging characteristic changes with temperature. However, since the battery and the voltage regulator are different from each other in installation location and in thermal capacity, in many cases the temperature increase correlation cannot hold and therefore it is difficult to control the output voltage of the voltage regulator to the predetermined value which is most suitable for charging the battery.

The generator is driven by an internal combustion engine as described above. Therefore, the conventional device is disadvantageous, in that, when the aforementioned predetermined value is controlled during the acceleration or deceleration of the engine or according to the speed of rotation thereof to control the mechanical load of the engine, i.e., the generator drive output, it is difficult to externally control the output. Also, it is impossible to detect problems in the charging system made up of the generator, a full-wave rectifier, a voltage regulator, the battery, the wiring, etc, such as those where no current is generated and no control is effected when the exciting circuit is broken, and where the output terminal of the rectifier is disconnected; and the service life of the battery cannot be detected.

SUMMARY OF THE INVENTION

Accordingly, an object of this invention is to provide a charge control microcomputer device for a vehicle, in which the above-described difficulties have each been eliminated.

DETAILED DESCRIPTION OF THE PREFERRED EMBODIMENT

Figure 1:
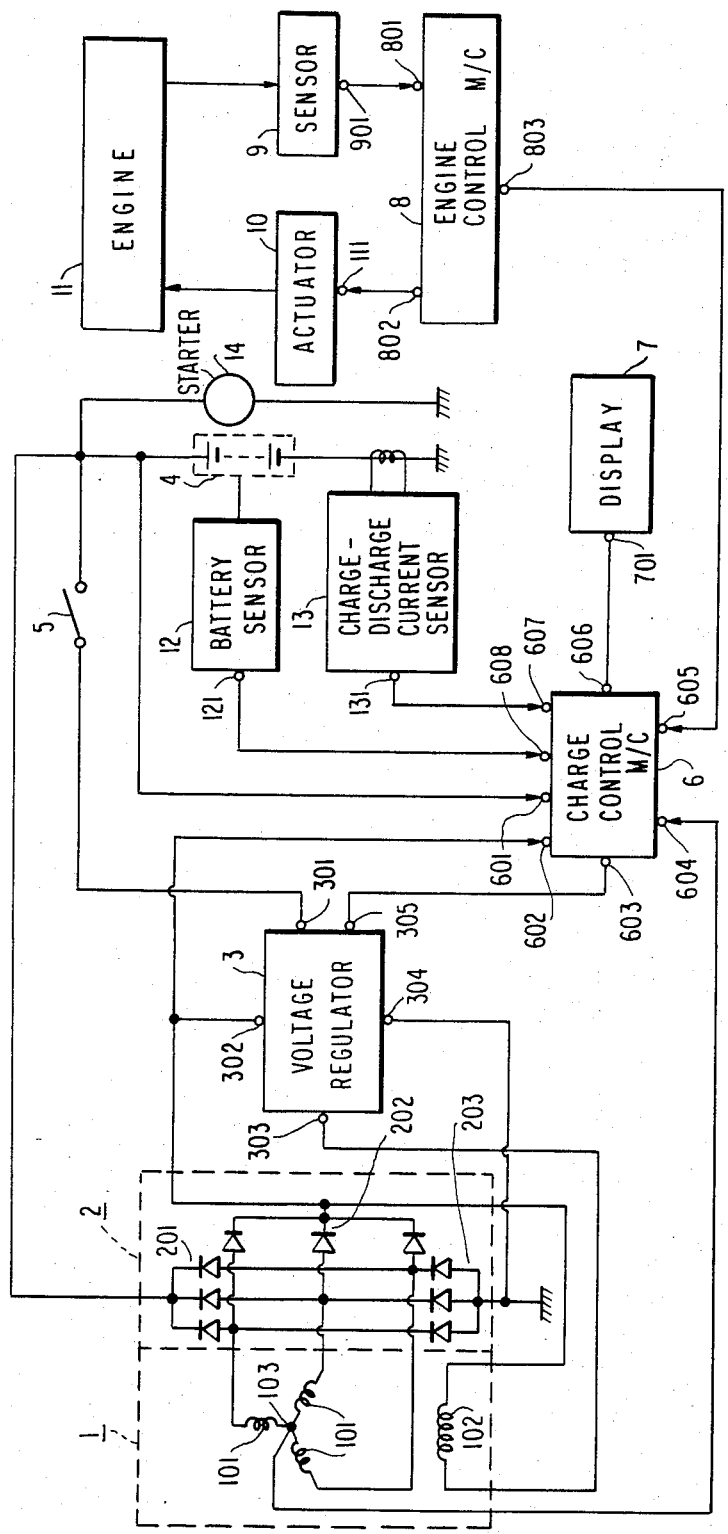
FIG. 1 is an electrical circuit diagram showing one example of a charge control microcomputer device for a vehicle according to this invention.

One example of the charging control microcomputer device according to the invention will be described with reference to FIG. 1. In this figure, reference numeral 11 designates an engine installed on a vehicle or the like; 1, a three-phase AC generator driven by the engine, the generator 1 having three-phase star-connected armature coils 101, a field coil 102 and a neutral point 103 at which generated voltage data is provided; 2, a full-wave rectifier for subjecting the AC output of the generator 1 to full-wave rectification, the rectifier 2 having a first rectifier output terminal 201, a second rectifier output terminal 202 and a ground terminal 203; 3, a voltage regulator for controlling the field current in the field coil 102, to control the output voltage of the generator 1; 301, an initial excitation terminal; 302, a voltage detection terminal; 303, a field coil terminal; 304, a ground terminal; and 305, an external control input terminal.

Further in FIG. 1, reference numeral 4 designates a battery which provides battery terminal voltage data; 5, a key switch; 6, a charging control microcomputer which processes at least one of the data from an engine controlling microcomputer 8 (described later), the battery terminal voltage data and the generated voltage data, detects problems according to the data from the charging system, such as the battery terminal voltage, the neutral point voltage data, battery sensor data, and charge-discharge current data, and transmits the detected results to a display unit 7; 601, a battery voltage input terminal; 602, a voltage input terminal for the second rectifier output terminal 202; 603, a reference signal output terminal through which an external control reference signal is applied to the external control input terminal 305 of the voltage regulator 3; 604, an input terminal for receiving the neutral point voltage of the generator 1; 605, an input terminal for receiving data from the engine controlling microcomputer 8; 606, an output terminal through which a display signal is applied to the display unit 7; 607, a charge-discharge current input terminal; and 608, an input terminal for receiving data from a battery sensor 12, which may detect such parameters as the battery solution temperature, acidity, etc.

Further in FIG. 1, reference numeral 7 designates the aforementioned display unit for displaying a result of troubleshooting; 701, a display signal input terminal; 8, the aforementioned engine controlling microcomputer; 801, an input terminal for receiving a signal from a sensor 9 (described later); 802, an engine control signal output terminal; 803, an output terminal through which data is applied to the charging control microcomputer 6; 901, a sensor signal output terminal; 10, an actuator for receiving a control signal from the microcomputer 8, to mechanically drive a part of the engine 11, 111, a control signal input terminal; 12, the aforementioned battery sensor; 121, a battery sensor data output terminal; 13, a charge-discharge current sensor; 131, a charge-discharge current output terminal; and 14, a starter.

Figure 2:
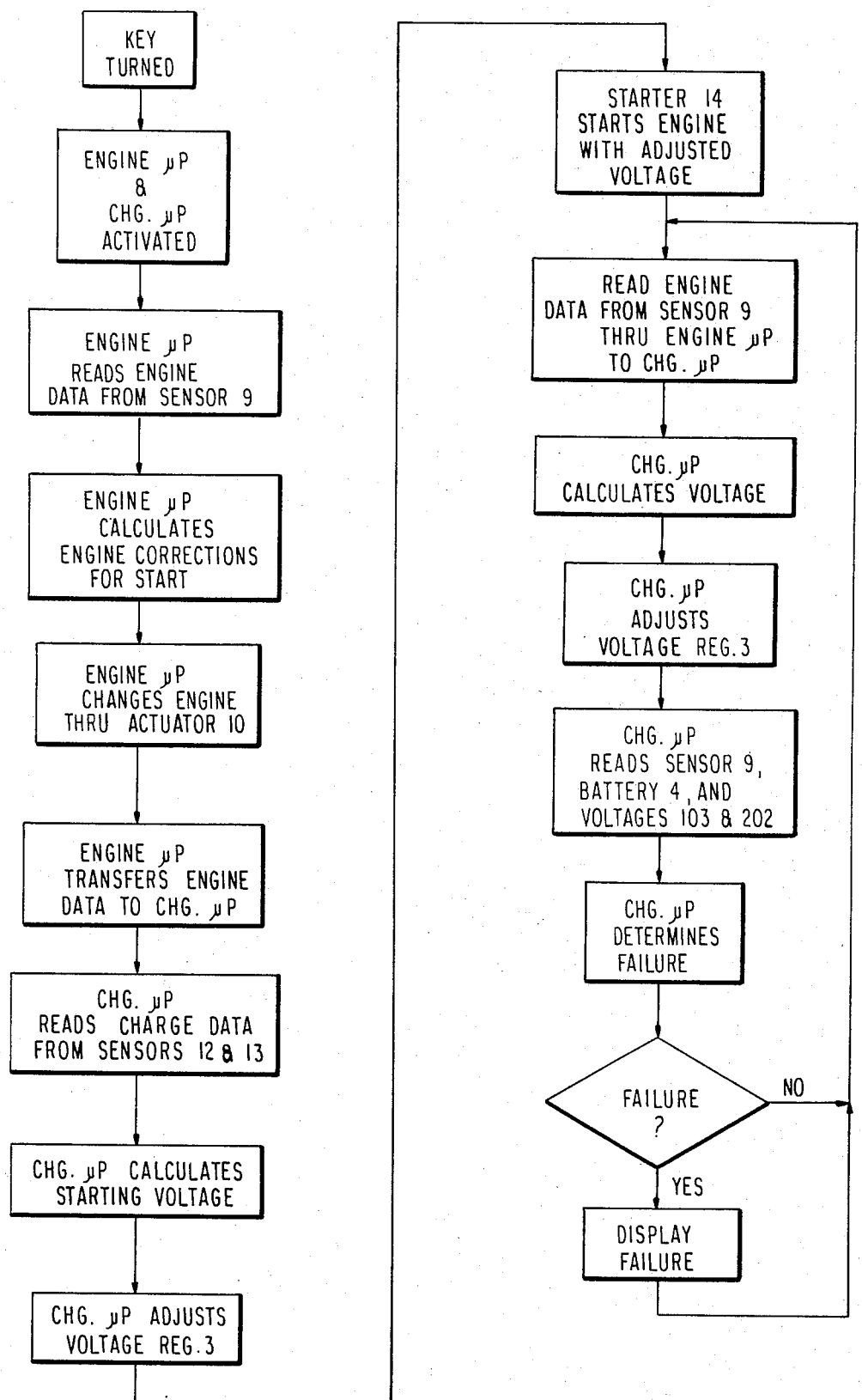
FIG. 2 is a flow diagram illustrating a use of the circuit of FIG. 1.

The operation of the device of this invention, which is arranged as described above, will now be described. The description is presented in summary form in the flow diagram of FIG. 2.

When the engine 11 is started, first the key switch 5 is closed. As a result, a circuit consisting of the battery 4, the key switch 5, the initial excitation terminal 301 of the voltage regulator 3, the voltage detection terminal 302, the field coil 102, the field coil terminal 303 and the ground terminal 304 is completed, so that an initial excitation current flows in the field coil 102, and a field magnetomotive force is generated. In this operation, the voltage of the battery 4 is applied through the key switch 5 to the microcomputers 6 and 8 and, when necessary, to the display unit 7, the sensor 9, the actuator 10, the battery sensor 12 and the charge-discharge current sensor 13, to operate these circuit elements. Therefore, the engine data 11 is detected by the sensor 9, and converted into an electrical signal. The engine data may include data such as the intake air temperature, the r.p.m., the crank angle, exhaust gas temperature, the air fuel ratio, etc. The electrical signal is applied through the sensor signal output terminal 901 to the sensor input terminal 801 of the engine controlling microcomputer 8, where it is processed. As a result, the microcomputer 8 provides a control signal which places the engine 11 in an optimum state for starting. The control signal is applied through the engine control signal output terminal 802 to the control signal input terminal of the actuator 10, to drive the latter, so that the engine is placed in the most suitable state for starting. The engine controlling microcomputer 8 applies the data from the sensor 9 through the data output terminal 803 to the data input terminal 605 of the charging control microcomputer 6. The charge control microcomputer 6 processes the engine data and the charge system data, to provide a predetermined value for the voltage regulator which is best for starting the engine 11. The predetermined value is applied to the reference signal output terminal 603.

When, under this condition, the engine 11 is started by the starter 14 to drive the generator 1, an AC output is induced in the armature coils 101 according to the speed of the generator 1 and is subjected to full-wave rectification in the full-wave rectifier 2. As the voltage regulator 3 carries out the on-off control of the field current in the field coil 102, the output voltage of the rectifier 2 is controlled to the reference voltage provided by the charge control microcomputer 6. The charge control microcomputer 6 processes the engine data from the engine controlling microcomputer 8 and the charge system data, during the operation of the engine 11, to apply the reference voltage which is most suitable for the engine 11 and the charge system, to the voltage regulator 3 through the reference signal output terminal 603.

When, under the above-described conditions, problems such as non-generation, non-control and disconnection of the first rectifier output terminal 201 occur in the charging system, the charging control microcomputer 6 performs internal processing using the data corresponding to the voltage of battery 4, the voltage at the second rectifier output terminal 202 and the voltage at the neutral point 103, which are applied respectively through the terminals 601, 602, and 603, to detect the failure. The result of detection is applied through the display signal output terminal 606 to the display unit 7, where it is displayed.

The internal resistance of the battery 4 is measured by utilizing the data from the charge-discharge current sensor 13 and the terminal voltage of the battery 4 when the starter is operated, and the data from the battery sensor 12 is taken into account, so that the service life of the battery is detected. The result of detection is transmitted to the display unit 7, where it is displayed.

As described above in detail, in the device of the invention, the charging control microcomputer internally processes at least one of the engine data from the engine controlling microcomputer and the charge system data such as the battery terminal voltage data and the generated voltage data, to apply the optimum reference voltage to the voltage regulator. Therefore, according to the invention, the reference voltage provided is the most suitable for charging the battery, and the mechanical load can be readily controlled during acceleration or deceleration of the engine.

Furthermore, various failures which the conventional device cannot detect can be detected by the device of the invention. These failures are displayed on the display unit separately according to the content thereof. Therefore, the invention is effective in preventing the over-discharging or over-charging of the battery or the occurrence of problems in the electrical load, and in reducing the time for repair. Since the service life of the battery can be detected before it becomes unserviceable according to the invention, the battery may be replaced by a new one before the occurrence of a problem where the engine cannot be started because of an unserviceable battery.

In the above-described embodiment, the generated voltage data is detected at the neutral point 103 of the armature coil 101; however, the same effect can be obtained by detecting the voltage at the second rectifier output terminal 202 or a one-phase output terminal of the armature coils 101.

What is claimed is:

1. A charging system for a vehicle, comprising:
   an AC generator driven by an engine, said generator having a rectifier, armature coils and a field coil;
   means for supplying generated voltage data from said generator;
   a battery charged by a rectified output of said generator;
   means for supplying battery terminal voltage data from said battery;
   a voltage regulator for controlling the current in said field coil, to control an output voltage of said generator to a predetermined value;
   means for supplying engine data from said engine;
   an engine controlling microcomputer for receiving said engine data, to control said engine;
   a charging control microcomputer for setting a reference voltage for said voltage regulator according to said engine data, said battery terminal voltage data and generated voltage data, and for detecting failures according to any of said data and;
   a display unit for displaying results of detecting of said charging control microcomputer.

2. A device as claimed in claim 1, further comprising a current sensor of battery charge-discharge and a battery sensor of an internal battery parameter, battery data being provided by said current sensor and said battery sensor, and wherein said charging control microcomputer further detects the service life of said battery on the basis of said battery terminal voltage data and said battery data.

3. A device as claimed in claim 2, said charging control microcomputer measuring the internal resistance of said battery on the basis of the data from said charge-discharge current sensor and said battery terminal voltage data.

4. A device as claimed in claim 1, wherein said generated voltage data includes the voltage of one output terminal of said generator rectifier, and the voltage of a selected point of said armature coils.

* * * * *